US012777746B2

(12) United States Patent
Lai et al.

(10) Patent No.: US 12,777,746 B2
(45) Date of Patent: Oct. 27, 2026

(54) LIGHT-EMITTING ELEMENT

(71) Applicant: EPISTAR CORPORATION, Hsinchu (TW)

(72) Inventors: Shih-Kuo Lai, Taichung (TW); Chao-Yi Tseng, Taipei (TW); Hai Lin, Jiangsu (CN); Zhong Ju, Jiangsu (CN)

(73) Assignee: ENNOSTAR CORPORATION, Hsinchu (TW)

( * ) Notice: Subject to any disclaimer, the term of this patent is extended or adjusted under 35 U.S.C. 154(b) by 578 days.

(21) Appl. No.: 18/225,435

(22) Filed: Jul. 24, 2023

(65) Prior Publication Data

US 2024/0030383 A1 Jan. 25, 2024

(30) Foreign Application Priority Data

Jul. 25, 2022 (CN) ......................... 202210877038.1

(51) Int. Cl.
*H01L 33/22* (2010.01)
*H10H 20/82* (2025.01)
*H10H 20/84* (2025.01)

(52) U.S. Cl.
CPC ............ *H10H 20/82* (2025.01); *H10H 20/84* (2025.01)

(58) Field of Classification Search
CPC ...... H10H 20/82; H10H 20/84; H10H 20/819; H10H 20/815; H10H 20/01335; H10H 20/817
See application file for complete search history.

(56) References Cited

U.S. PATENT DOCUMENTS

| | | | | |
|---|---|---|---|---|
| 2012/0319162 | A1* | 12/2012 | Araki | H01L 21/02631 257/E33.023 |
| 2017/0069793 | A1* | 3/2017 | Saito | H10H 20/01335 |
| 2019/0334059 | A1* | 10/2019 | Chen | H10H 20/82 |
| 2022/0344538 | A1* | 10/2022 | Liu | H10H 20/825 |

* cited by examiner

*Primary Examiner* — Mohammed R Alam
(74) *Attorney, Agent, or Firm* — DITTHAVONG, STEINER & MLOTKOWSKI

(57) ABSTRACT

A light-emitting element includes a substrate includes an upper surface; a plurality of protrusions formed on the upper surface, wherein the plurality of protrusions includes a height less than or equal to 1 μm; and a stack structure formed on the substrate, wherein the stack structure includes a first doped semiconductor layer, a light-emitting layer, and a second doped semiconductor layer, wherein the stack structure includes a total thickness less than 4 μm.

20 Claims, 6 Drawing Sheets

LIGHT-EMITTING ELEMENT

TECHNICAL FIELD

The application relates to a light-emitting element, and more particularly, to a light-emitting element including a patterned substrate.

REFERENCE TO RELATED APPLICATION

This application claims the right of priority based on CN Application Serial No. 202210877038.1, filed on Jul. 25, 2022, and the content of which is hereby incorporated by reference in its entirety.

DESCRIPTION OF BACKGROUND ART

III-V materials are becoming more and more important in semiconductor related industries. Due to the lattice mismatch on the heterogeneous interface between the substrate and the III-V materials, it is difficult to grow III-V materials on the heterogeneous substrate without defects or cracks. Usually, one or more buffer layers are formed therebetween for stress adjustment to solve the above problems.

A patterned substrate including a protruding portion is beneficial for promoting the brightness of the LED chip. However, if the size of the protruding portion of the patterned substrate is too large, the thickness of the buffer layer will be too thick, which will be unfavorable for small sized chips.

SUMMARY OF THE APPLICATION

In accordance with an embodiment of the present application, a light-emitting element includes a substrate including an upper surface; a plurality of protrusions formed on the upper surface, wherein the plurality of protrusions includes a height less than or equal to 1 μm; and a stack structure formed on the substrate, wherein the stack structure includes a first doped semiconductor layer, a light-emitting layer, and a second doped semiconductor layer, wherein the stack structure includes a total thickness less than 4 μm.

DETAILED DESCRIPTION OF PREFERRED EMBODIMENTS

Figure 1A:
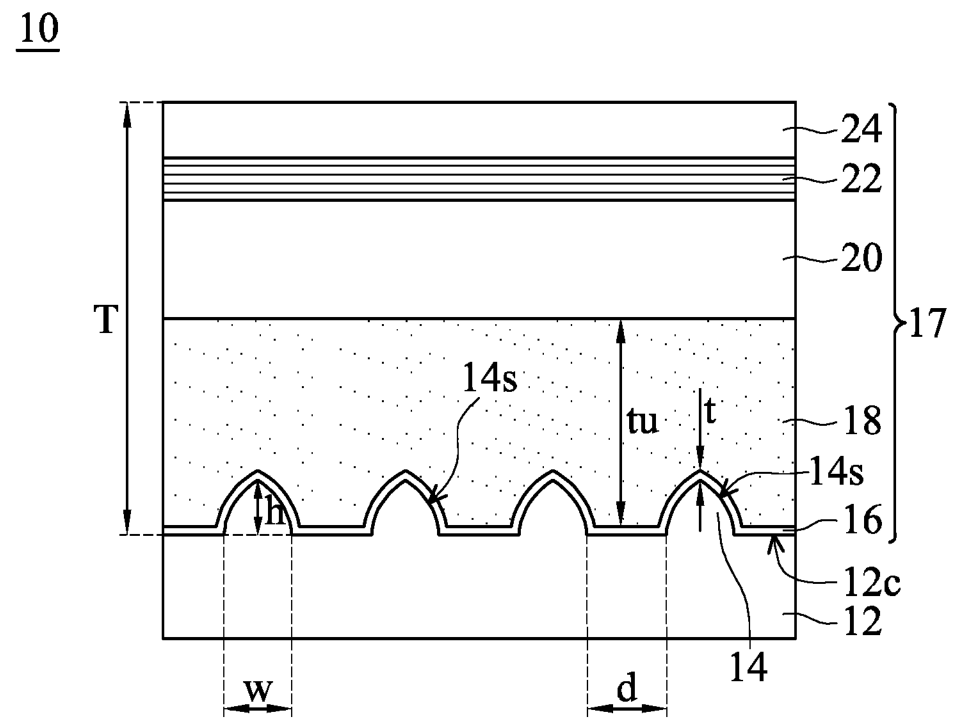
FIG. 1A illustrates a cross-sectional view of a light-emitting element in accordance with an embodiment of the present application.

The embodiment of the application is illustrated in detail, and is plotted in the drawings. The same or the similar part is illustrated in the drawings and the specification with the same number.

As shown in FIG. 1A, in accordance with an embodiment of the present application, a light-emitting element 10 is provided. FIG. 1A illustrates a cross-sectional view of the light-emitting element 10.

As shown in FIG. 1A, the light-emitting element 10 includes a substrate 12, a plurality of protrusions 14, and a stack structure 17. The protrusion 14 is formed on the substrate 12 and located between the substrate 12 and the stack structure 17. The stack structure 17 is formed on the substrate 12 and the protrusion 14. The stack structure 17 includes a buffer layer 16, an undoped semiconductor layer 18, a first doped semiconductor layer 20, a light-emitting layer 22, and a second doped semiconductor layer 24. The buffer layer 16 is conformably formed on an upper surface 12*c* of the substrate 12 and the protrusion 14. The undoped semiconductor layer 18 is formed on the substrate 12, and covers the buffer layer 16 and the protrusion 14. The first doped semiconductor layer 20 is formed on the undoped semiconductor layer 18. The light-emitting layer 22 is formed on the first doped semiconductor layer 20. The second doped semiconductor layer 24 is formed on the light-emitting layer 22. It should be noted that the protrusion 14 includes a height h less than or equal to 1 μmicron (μm), for example, between 0.5 μm and 0.9 μm or between 0.65 μm and 0.95 μm. The stack structure 17 includes a thickness T less than 5 μm or less than 4 μm, for example, between 3.8 μm to 4.8 μm, between 3.5 μm to 4.5 μm, or between 3 μm to 4 μm. In some embodiments, when the light-emitting device 10 retains the substrate 12, the light-emitting element 10 includes a total thickness less than 110 μm, for example, between 60 μm~80 μm or between 70 μm~90 μm. In some embodiments, when the substrate 12 is removed from the light-emitting element 10, the light-emitting element 10 includes a total thickness less than 20 μm, for example, between 5 μm~10 μm.

In an embodiment, the substrate 12 can be a growth substrate for epitaxially growing the buffer layer and the semiconductor layers. The substrate 12 includes a gallium arsenide (GaAs) wafer for the epitaxial growth of aluminum gallium indium phosphide (AlGaInP), or a sapphire ($Al_2O_3$) wafer, a gallium nitride (GaN) wafer, a silicon carbide (SiC) wafer, or an aluminum nitride (AlN) wafer for the epitaxial growth of gallium nitride (GaN), indium gallium nitride (InGaN), or aluminum gallium nitride (AlGaN). The application is not limited thereto, and other suitable substrate materials are also applicable to the application.

In some embodiments, in atop view, the protrusion 14 includes a circle, an ellipse, or a polygon. The polygon includes a pattern selected from a triangle, a quadrangle, and a hexagon. In a side view, the protrusion 14 includes a cone shape. As shown in FIG. 1A, in the cross-sectional view, the protrusion 14 includes two arcs intersecting at a vertex. However, the present application is not limited thereto, and other cross section shapes are also applicable to the present application, such as semicircle or polygon. In some embodiments, the width w of the protrusion 14 is between 0.3 μm~3

μm. In another embodiment, the width w of the protrusion 14 is between 0.5 μm~2 μm. In another embodiment, the width w of the protrusion 14 is between 0.6 μm~1.6 μm. In some embodiments, the aspect ratio h/w of the protrusion 14 is between 0.55~0.85 or less than 0.7. In some embodiments, the distance d between the protrusions 14 is between 0.1 μm~0.3 μm. In some embodiments, the substrate 12 includes a plane (for example, the upper surface 12*c*) formed by the (0001) C plane, in order to retain more C-plane to improve the epitaxial quality of the stack structure 17, the distance d between the protrusions 14 can be between 0.5 μm~2 μm or between 0.6 μm~1.6 μm.

Taking sapphire as an example of the substrate 12 for a gallium nitride blue light-emitting diode, the substrate 12 including the protrusion 14 benefits the epitaxial growth and increases the light scattering at the interface between gallium nitride and sapphire. In some embodiments, when the aspect ratio h/w of the protrusion 14 is greater than 0.85, it is not easy for the subsequent growth of forming undoped semiconductor layer 18. In some embodiments, when the aspect ratio h/w of the protrusion 14 is less than 0.55, it is unfavorable for the light extraction efficiency of the light-emitting element 10.

Figure 1B:
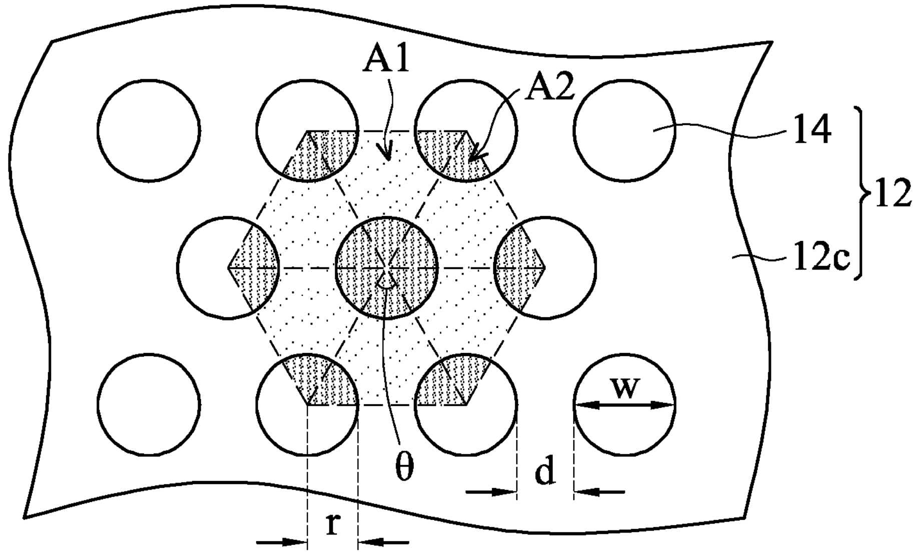
FIG. 1B illustrates a partial top view of a substrate of the light-emitting element.

FIG. 1B illustrates a partial top view of the substrate 12 in accordance with an embodiment of the present application. The substrate 12 includes a surface with a (0001) C-plane (for example, the upper surface 12*c*), and a reflective surface formed by the protrusion 14 not parallel to the C-plane on the upper surface 12*c*. In some embodiments, the area of the upper surface 12*c* of the substrate 12 not occupied by the protrusions 14 is A1, and the area of the reflective surface formed by the protrusion 14 is A2. In some embodiments, the ratio C % of the total area A1 of the C-plane of the upper surface 12*c* besides the protrusion 14 to the total area A2 of the reflective surface of the protrusions 14 is greater than 35%, for example, between 40% and 50%.

In some embodiments, when the top view shape of the protrusion 14 includes a circle with a radius r and a diameter (width) w, and the cross-sectional view shape of the protrusion 14 includes a triangle or a triangular-like cone with a height h as shown in FIG. 1A. As shown in FIG. 1B, an equilateral triangle is imagined with the centers of three adjacent protrusions 14. In the region of this equilateral triangle, the total area A2 of the reflective surface of the protrusion 14 can be calculated by the formula of the lateral surface area of the cone $$A2 = 3\times\pi\times r\times\sqrt{(r^2+h^2)}\times\frac{\theta}{360}.$$

In an example where θ is 60 degrees, the total area A2 of the reflective surface of the protrusion 14 can be simplified as $$A2 = \pi\times r\times\sqrt{(r^2+h^2)}\times\frac{1}{2}.$$

The total area A1 of the C-plane is the area of the equilateral triangle minus the area occupied by the bottom surface of the protrusion 14 in the region of this equilateral triangle, which can be obtained by the formula $$A1 = \frac{\sqrt{3}}{4}\times(w+d)^2 - \frac{\pi r^2}{2}.$$

In some embodiments, when the top view shape of the protrusion 14 includes a circle with a radius r and a diameter (width) w, and the cross-sectional view shape of the protrusion 14 includes a curved surface or an inclined surface with multiple different slopes (not shown), as shown in FIG. 1B, an equilateral triangle is imagined with the centers of three adjacent protrusions 14. In the region of this equilateral triangle, the total area A2 of the reflective surface of the protrusion 14 can be simplified as $$A2 = \pi\times r^2\times\frac{1}{2}.$$

The total area A1 of the C plane is the area of the equilateral triangle minus the area occupied by the bottom surface of the protrusion 14 in the region of this equilateral triangle, which can be obtained by the formula $$A1 = \frac{\sqrt{3}}{4}\times(w+d)^2 - \frac{\pi r^2}{2}.$$

In some embodiments, when the ratio C % is less than 35%, the undoped semiconductor layer 18 is not easily formed on the C plane of the substrate 12, and the undoped semiconductor layer 18 cannot be completely grown on the recessed area formed between the plurality of protrusions 14, so that the upper surface of the undoped semiconductor layer 18 includes an uneven topography, which deteriorates the epitaxial quality of the first doped semiconductor layer 20, the light-emitting layer 22, and the second doped semiconductor layer 24 formed on the undoped semiconductor layer 18. In some embodiments, when the ratio C % is greater than 50%, the total area of the reflective surface of the protrusion 14 decreases which reduces the light extraction efficiency.

In some embodiments, in order to completely grow the undoped semiconductor layer 18 in the recessed area between the plurality of protrusions 14 and reduce the unevenness of the upper surface of the undoped semiconductor layer 18, the total area A1 of the C plane of the upper surface 12*c* besides the protrusion 14 is greater than the total area A2 of the reflective surface of the protrusion 14. In this embodiment, the width w of the protrusion 14 is between 0.5 μm~2 μm or between 0.6 μm~1.6 μm. The distance d between the protrusions 14 can be between 0.5 μm~2 μm or between 0.6 μm~1.6 μm. The aspect ratio h/w of the protrusion 14 ranges from 0.55~0.85 or less than 0.7.

In some embodiments, the plurality of protrusions 14 on the upper surface 12*c* of the substrate 12 can be formed by pattern printing, dry etching, or wet etching.

In some embodiments, the buffer layer 16, the undoped semiconductor layer 18, the first doped semiconductor layer 20, the light-emitting layer 22, and second doped semiconductor layer 24 can be formed by metal organic chemical vapor deposition (MOCVD), molecular beam epitaxy (MBE), hydride vapor deposition (HVPE), physical vapor deposition (PVD), or ion plating method on the substrate 12, wherein physical vapor deposition method includes sputtering or evaporation method.

The buffer layer 16 is provided to alleviate the lattice constant difference between the substrate 12 and the undoped semiconductor layer 18, reduce epitaxial defects, and improve the epitaxial quality of the semiconductor layers grown thereon. In some embodiments, the buffer layer 16 includes insulating materials of group V elements or group VI elements, such as $TiO_x$, $Al_xN_y$, $Al_xO_y$, $Al_xO_yN_z$, $SiO_x$, or $SiN_x$. In some embodiments, the buffer layer 16 includes group III-V materials, such as aluminum nitride (AlN), gallium nitride (GaN), or aluminum gallium nitride (AlGaN).

In some embodiments, the protrusion 14 includes the same material as the substrate 12. For example, when the substrate 12 is a sapphire substrate composed of aluminum oxide ($Al_2O_3$), the material of the protrusion 14 includes aluminum oxide.

In some embodiments, the thickness t of the buffer layer 16 is less than 35 nm, for example, between 15 nm and 25 nm. The thickness t greater than 35 nm does not provide obvious improvement in alleviating lattice differences and the production time takes longer. In some embodiments, the thickness t of the buffer layer 16 is less than 20 nm, for example, between 8 nm and 14 nm. In some embodiments, the difference between the thickness of the buffer layer 16 at the sidewall 14*s* of the protrusion 14 and the thickness of the buffer layer 16 on the upper surface 12*c* of the substrate 12 is less than or equal to 20 angstroms (Å). In another embodiment, less than or equal to 15 angstroms (Å). In another embodiment, less than or equal to 10 angstroms (Å). In some embodiments, the thickness standard deviation of the buffer layer 16 on the sidewall 14*s* of the protrusion 14 is less than 10 angstroms (Å), and/or the thickness standard deviation of the buffer layer 16 on the upper surface 12*c* of the substrate 12 is less than 10 Å. In some embodiments, the difference between the thickness standard deviation of the buffer layer 16 on the sidewall 14*s* of the protrusion 14 and the thickness standard deviation of the buffer layer 16 on the upper surface 12*c* of the substrate 12 is less than or equal to 5 Å, or less than or equal to 3 Å, or less than or equal to 1 Å. In some embodiments, the buffer layer 16 includes aluminum nitride (AlN). In some embodiments, the buffer layer 16 includes aluminum oxynitride ($AlO_xN_y$). The buffer layer 16 includes an aluminum content or a nitrogen content greater than the oxygen content, and the aluminum content is greater than or less than the nitrogen content.

In some embodiments, the buffer layer 16 is formed by physical vapor deposition (PVD). The ratio of the aluminum content to the nitrogen content of the buffer layer 16 including aluminum oxynitride ($AlO_xN_y$) is 0.2~0.4. It should be noted that the difference between the aluminum content of the buffer layer 16 on the sidewall 14*s* of the protrusion 14 and the aluminum content of the buffer layer 16 on the upper surface 12*c* of the substrate 12 is greater than 5% but less than 12%.

In some embodiments, the buffer layer 16 is formed by metal organic chemical vapor deposition (MOCVD). The thickness of the buffer layer 16 on the sidewall 14*s* of the protrusion 14 is smaller than the thickness of the buffer layer 16 on the upper surface 12*c* of the substrate 12. The ratio of the aluminum content to the nitrogen content of the buffer layer 16 including aluminum oxynitride ($AlO_xN_y$) is 0.4~0.9, 0.45~0.9, 0.4~0.8, or 0.5~0.7. It should be noted that the difference between the aluminum content of the buffer layer 16 on the sidewall 14*s* of the protrusion 14 and the aluminum content of the buffer layer 16 on the upper surface 12*c* of the substrate 12 is less than 5%.

The undoped semiconductor layer 18 can prevent the crystal defects from propagating to the light-emitting layer 22. The undoped semiconductor layer 18 may include n-type doping or not include n-type doping. When the undoped semiconductor layer 18 does not include n-type doping, the crystallinity of the undoped semiconductor layer 18 can be improved. Therefore, the undoped semiconductor layer 18 can be selected not including n-type doping, and the defects in the undoped semiconductor layer 18 can be reduced by increasing the thickness of the undoped semiconductor layer 18. In some embodiments, the undoped semiconductor layer 18 includes unintentional doping, such as carbon (C), oxygen (O), silicon (Si), hydrogen (H), or any combination of the above. The unintentional doping concentration is not greater than 1E+18 atoms/$cm^3$ or not greater than 1E+17 atoms/$cm^3$. The thickness of the undoped semiconductor layer 18 is greater than 0.5 μm and less than 1 μm or 1.5 μm thicker than the height of the protrusions 14 to completely cover the plurality of protrusions 14 and form a flat surface. If the thickness of the undoped semiconductor layer 18 is too thin, the subsequently formed semiconductor layer does not grow to have a flat surface because it cannot completely cover the plurality of protrusions 14, thereby affecting the epitaxial quality of the subsequently formed semiconductor layer. However, if the thickness of the undoped semiconductor layer 18 is increased above a certain level, the effect of the thickness increase of the undoped semiconductor layer 18 corresponding to the defect reduction is saturated.

In some embodiments, the undoped semiconductor layer 18 includes an undoped III-V semiconductor, for example, an undoped binary, ternary, or quaternary III-V semiconductor. In some embodiments, the undoped binary III-V semiconductor includes undoped gallium nitride (GaN), but the application is not limited thereto. Other suitable undoped binary III-V semiconductors are also applicable to this application. In some embodiments, the undoped ternary III-V semiconductor includes undoped indium gallium nitride (InGaN) or aluminum gallium nitride (AlGaN), but the application is not limited thereto, other suitable undoped doped ternary III-V semiconductors are also applicable to this application. In some embodiments, the undoped quaternary III-V semiconductor includes undoped indium aluminum gallium nitride (InAlGaN), but the application is not limited thereto, other suitable undoped quaternary III-V Group semiconductors are also applicable to this application. In some embodiments, the maximum thickness tu of the undoped semiconductor layer 18 is less than 2.2 μm, for example, less than 2 μm, between 1.4 μm~1.8 μm, or between 1.6 μm~1.7 μm.

In some embodiments, the first doped semiconductor layer 20 includes an n-type doped III-V semiconductor, for example, an n-type doped binary, ternary, or quaternary III-V semiconductor. In some embodiments, the n-type doped binary III-V semiconductor includes n-type doped gallium nitride (GaN), but the application is not limited thereto, other suitable n-type doped binary III-V semiconductors are also applicable to this application. In some embodiments, the n-type doped ternary III-V semiconductor includes n-type doped indium gallium nitride (InGaN) or aluminum gallium nitride (AlGaN), but the present application is not limited thereto, other suitable n-type doped ternary III-V semiconductors are also applicable to the present application. In some embodiments, the n-type doped quaternary III-V semiconductor includes n-type doped indium aluminum gallium nitride (InAlGaN), but the application is not limited thereto, other suitable n-type doped quaternary III-V semiconductors are also applicable to this application. The n-type doping includes silicon (Si), carbon (C), germanium (Ge), or oxygen (O), but the present application is not limited thereto, and other suitable group IV or VI elements are also applicable to the present application. In the embodiment, silicon (Si) is illustrated as an example. The n-type doping concentration of the first doped semiconductor layer 20 is less than or equal to 5E+19 atoms/$cm^3$, or less than or equal to 2.5E+19 atoms/$cm^3$, and greater than or equal to 2.5E+18 atoms/$cm^3$, or greater than or equal to 1E+19 atoms/$cm^3$. Since the greater the thickness of the first doped semiconductor layer 20 is, the lower of the resistance thereof is. However, as the thickness of the first doped semiconductor layer 20 is increased, the production cost is also increased. Therefore, in view of the manufacturing, the thickness of the first doped semiconductor layer 20 is less than 2 μm, for example, between 1.3 μm~1.7 μm, or between 1.5 μm~1.6 μm. In some embodiments, a ratio between the thickness of the first doped semiconductor layer 20 and the thickness of the undoped semiconductor layer 18 is greater than 0.8, for example, between 0.9~1.1.

In some embodiments, the light-emitting layer 22 includes a multiple-quantum well (MQW) structure including one or more barrier layers and one or more well layers alternately stacked. The one or more barrier layers include an energy band gap higher than that of the well layer. For example, the barrier layer includes gallium nitride (GaN) or aluminum gallium nitride (AlGaN) material, and the well layer includes indium gallium nitride (InGaN) material, but the present application is not limited thereto, the multiple quantum well structure formed by alternately stacking barrier layers and well layers based on other III-V semiconductor materials is also applicable to this application.

In some embodiments, the second doped semiconductor layer 24 includes a p-type doped III-V semiconductor, for example, a p-type doped binary, ternary, or quaternary III-V semiconductor. In some embodiments, the p-type doping includes magnesium (Mg), beryllium (Be), calcium (Ca), or strontium (Sr), but the present application is not limited thereto, and other suitable group II elements are also applicable to the present application. In some embodiments, the p-type doped binary III-V semiconductor includes p-type doped gallium nitride (GaN), but the application is not limited thereto. Other suitable p-type doped binary III-V semiconductors are also applicable to this application. In some embodiments, the p-type doped ternary III-V semiconductor includes p-type doped indium gallium nitride (InGaN), aluminum indium nitride (AlInN), or aluminum gallium nitride (AlGaN), but the present application is not limited thereto, and other suitable p-type doped ternary III-V group semiconductors are also applicable to the present application. In some embodiments, the p-type doped quaternary III-V semiconductor includes p-type doped indium aluminum gallium nitride (InAlGaN), but the present application is not limited thereto, other suitable p-type doped quaternary III-V semiconductors are also applicable to this application.

As shown in FIG. 1A, in accordance with the embodiment of the application, the substrate 12 of the light-emitting element 10 includes a sapphire substrate. The height h of the protrusions 14 is 1.0±0.2 μm, the width w is 1.60±0.2 μm, and the distance d is 0.20±0.1 μm. The undoped semiconductor layer 18 includes undoped gallium nitride (GaN), and the thickness tu of the undoped semiconductor layer 18 is 1.44±0.4 μm. The first doped semiconductor layer 20 includes n-type doped gallium nitride (GaN), and the thickness of the first doped semiconductor layer 20 is 1.31±0.2 μm. The light-emitting layer 22 includes a multiple quantum well (MQW) structure, which is alternately stacked by multiple gallium nitride (GaN) based barrier layers, such as GaN, AlGaN, and multiple indium gallium nitride (InGaN) based well layers. In an embodiment, the alternately stacking number of InGaN/GaN is less than 12, and the total thickness of InGaN/GaN layers can be less than 500 nm or less than 300 nm, but greater than 200 nm, such as 450 nm~480 nm. The second doped semiconductor layer 24 includes p-type doped gallium nitride (GaN), the doping concentration of the p-type doping (for example, magnesium) is 1.39E+18 atoms/$cm^3$, and the thickness thereof is less than 300 nm or 200 nm, but greater than 100 nm, such as 250 nm~280 nm. The stack structure 17 of the light-emitting element 10 includes a total thickness T of 3.12±0.8 μm.

In the light-emitting element of the comparative example, the substrate is a sapphire substrate. The height of the protrusion is 1.75±0.1 μm, the width of the protrusion is 2.80±0.05 μm, and the distance between the protrusions is 0.20±0.05 μm. The undoped semiconductor layer is undoped gallium nitride (GaN) with a thickness of 2.48 μm. The first doped semiconductor layer is n-type doped gallium nitride (GaN) with a thickness of 1.8 μm. The light-emitting layer includes a multiple quantum well (MQW) structure formed by alternately stacking multiple gallium nitride (GaN) based barrier layers and multiple indium gallium nitride (InGaN) based well layers. The alternately stacking number of InGaN/GaN is 16, and the total thickness of InGaN/GaN layers is 542 nm. The second doped semiconductor layer is p-type doped gallium nitride (GaN) including p-type doping concentration of 2.29E+17 atoms/$cm^3$ and the thickness thereof is 338.7 nm. The thickness of the stack structure of the light-emitting element of the comparative example is 5.25 μm.

The main structure differences between the light-emitting element 10 of the embodiment of the present application and the light-emitting element of the comparative example are the size of the protrusion, the thickness of the undoped semiconductor layer, the alternately stacking number of the light-emitting layer, the thickness of the second doped semiconductor layer, and the magnesium doping concentration of the second doped semiconductor layer. Since the size of the protrusion 14 of the light-emitting element 10 (height h: 1.0±0.2 μm, width w: 1.60±0.2 μm) is smaller than the size of the protrusion of the light-emitting element of the comparative example (height: 1.75±0.1 μm, width: 2.80±0.05 μm), the thickness of the undoped semiconductor layer 18 (1.44 μm) of the light-emitting element 10 can be designed to be thinner than the thickness of the undoped semiconductor layer (2.48 μm) of the light-emitting element of the comparative example. In the embodiment of the present application, the compressive stress between the epitaxial layers can be reduced, the variability of the emission wavelength between the center and the edge of the wafer can be reduced, and the emission uniformity can be improved.

In addition, since the alternately stacking number of InGaN/GaN stacks (12 layers) of the light-emitting layer 22 of the light-emitting element 10 is smaller than the alternately stacking number of InGaN/GaN stacks (16 layers) of the light-emitting layer of the light-emitting element of the comparative example, the stack structure of the light-emitting element 10 includes a thickness T (3.12 μm) smaller the thickness (5.25 μm) of the stack structure of the light-emitting element of the comparative example, the overall compressive stress and the thickness of the stress release layer can be reduced in the light-emitting element 10, thereby shortening the manufacturing process time and improving productivity. In the embodiment, reducing the alternately stacking number of the light-emitting layer does not affect the photoelectric characteristics of the light-emitting element 10.

Furthermore, since the size of the protrusion 14 of the light-emitting element 10 is smaller than that of the light-emitting element of the comparative example, the V-shaped defects of the light-emitting layer 22 can be decreased or reduced so there is no need to increase the thickness of the subsequently formed semiconductor layer to fill up the V-shaped defects of the light-emitting layer 22, and the thickness of the second doped semiconductor layer 24 (for example, 273 nm) of the light-emitting element 10 can be designed to be thinner than the thickness of the second doped semiconductor layer (for example, 338.7 nm) of the light-emitting element of the comparative example. In the embodiment, better epitaxy quality can be obtained with a thinner stack structure, thereby improving the current transmission and reducing the forward voltage of the light-emitting element 10.

Further, since the magnesium doping concentration (1.39E+18 atoms/$cm^3$) of the light-emitting element 10 is higher than the magnesium doping concentration (2.29E+17 atoms/$cm^3$) of the light-emitting element of the comparative example, therefore, the current transmission and the electrostatic protection capabilities can be improved, and the forward voltage of the light-emitting element 10 can be reduced.

Figure 2A:
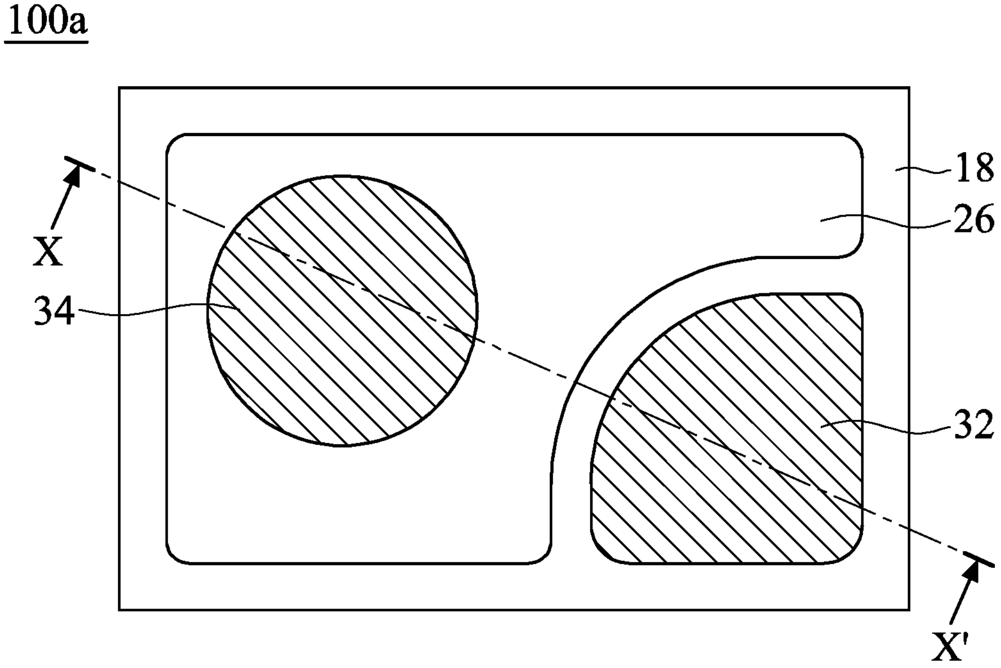
FIG. 2A illustrates a top view of a light-emitting element in accordance with an embodiment of the present application.
Figure 2B:
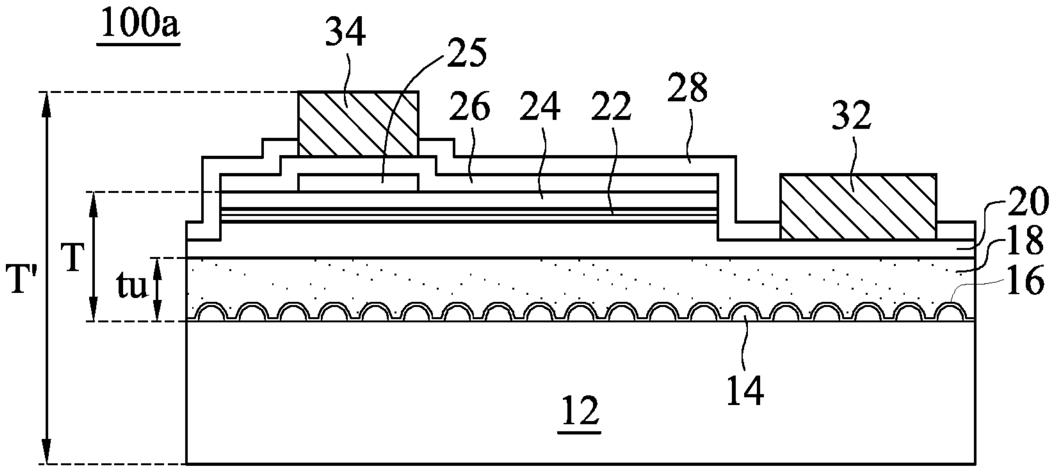
FIG. 2B illustrates a cross-sectional view of the light-emitting element in accordance with an embodiment of the present application.

As shown in FIGS. 2A and 2B, a light-emitting element 100*a* is provided in accordance with an embodiment of the present application. FIG. 2A illustrates atop view of the light-emitting element 100*a*. FIG. 2B illustrates a cross-sectional view along the line X-X' of the light-emitting element 100*a* in FIG. 2A.

In FIGS. 2A and 2B, the light-emitting element 100*a* includes the substrate 12, the plurality of protrusions 14, the buffer layer 16, the undoped semiconductor layer 18, the first doped semiconductor layer 20, the light-emitting layer 22, the second doped semiconductor layer 24, a current blocking layer 25, a transparent conductive layer 26 (for example, indium tin oxide (ITO)), a protective layer 28, a first conductive pad 32, and a second conductive pad 34. The protrusion 14 is formed on the substrate 12. The undoped semiconductor layer 18 and the first doped semiconductor layer 20 are formed on the substrate 12 and cover the protrusion 14. The light-emitting layer 22 is formed on the first doped semiconductor layer 20. The second doped semiconductor layer 24 is formed on the light-emitting layer 22. The current blocking layer 25 is formed on the second doped semiconductor layer 24. The transparent conductive layer 26 is formed on the second doped semiconductor layer 24 and covers the current blocking layer 25. The protective layer 28 is conformably formed on the first doped semiconductor layer 20, the light-emitting layer 22, the second doped semiconductor layer 24, and the transparent conductive layer 26. The first conductive pad 32 is electrically connected to the first doped semiconductor layer 20 by passing through the protective layer 28. The second conductive pad 34 is electrically connected to the second doped semiconductor layer 24 by passing through the protective layer 28 to connect the transparent conductive layer 26. In some embodiments, the current blocking layer 25 includes an insulating material, which can prevent the electrical current from directly flowing into the second doped semiconductor layer 24 from the second conductive pad 34. In some embodiments, the current blocking layer 25 includes a Distributed Bragg Reflector (DBR) to increase the light extraction efficiency of the light-emitting element 100*a*. The light-emitting element 100*a* includes a total thickness T' less than 110 μm, for example, between 60 μm~80 μm or between 70 μm~90 μm.

In the light-emitting element 100*a* illustrated in FIG. 2B, the material and the size of the substrate 12, the protrusion 14, the buffer layer 16, the undoped semiconductor layer 18, the first doped semiconductor layer 20, the light-emitting layer 22, and the second doped semiconductor layer 24 are similar to those of the components with same labels of the light-emitting element 10 illustrated in FIG. 1A and the design of the substrate 12 illustrated in FIG. 1B, and those will not be repeated here.

As shown in FIG. 2A and FIG. 2B, the light-emitting element 100*a* is electrically connected to an external circuit through the first conductive pad 32 and the second conductive pad 34.

The light-emitting element 100*a* can be packaged by wire bonding. The light-emitting element 100*a* can be applied to an indoor display, for example, a TV or other displays suitable for indoor use.

Figure 3A:
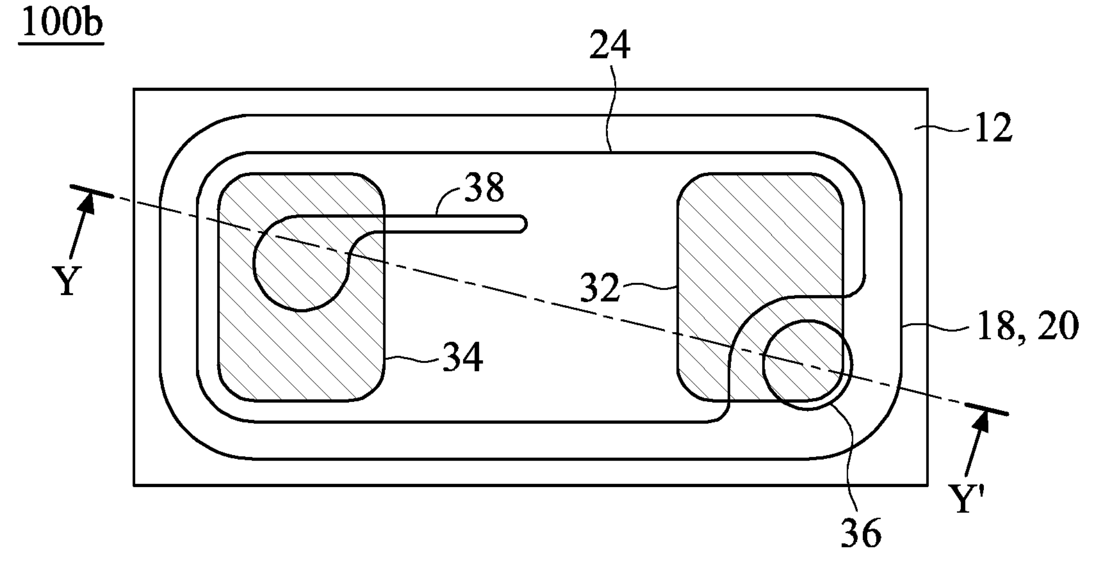
FIG. 3A illustrates a top view of a light-emitting element in accordance with an embodiment of the present application.
Figure 3B:
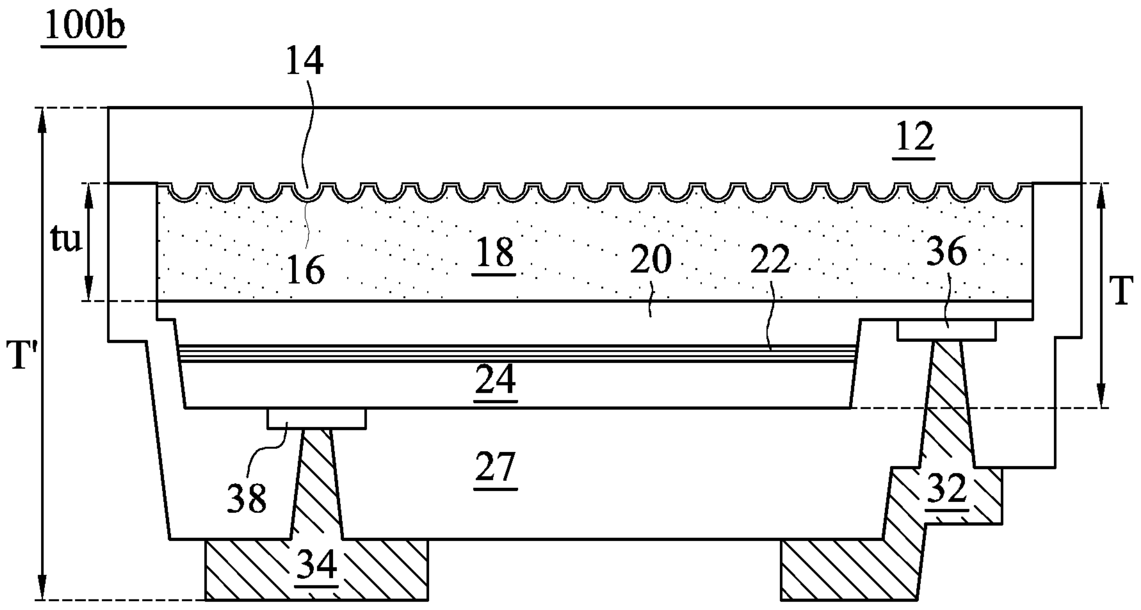
FIG. 3B illustrates a cross-sectional view of a light-emitting element in accordance with an embodiment of the present application.

As shown in FIGS. 3A and 3B, a light-emitting element 100*b* is provided in accordance with an embodiment of the present application. FIG. 3A illustrates atop view of the light-emitting element 100*b*. FIG. 3B illustrates a cross-sectional view along the line Y-Y' of the light-emitting element 100*b* in FIG. 3A.

As shown in FIG. 3B, the light-emitting element 100*b* includes the substrate 12, the plurality of protrusions 14, the buffer layer 16, the undoped semiconductor layer 18, the first doped semiconductor layer 20, the light-emitting layer 22, the second doped semiconductor layer 24, an insulating layer 27, the first conductive pad 32, the second conductive pad 34, a first conductive contact 36, and a second conductive contact 38. The protrusion 14 is formed on the substrate 12. The undoped semiconductor layer 18 is formed on the substrate 12 and covers the protrusion 14. The light-emitting layer 22 is formed on the first doped semiconductor layer 20. The second doped semiconductor layer 24 is formed on the light-emitting layer 22. The first conductive contact 36 is formed on the first doped semiconductor layer 20. The second conductive contact 38 is formed on the second doped semiconductor layer 24. The insulating layer 27 is conformally formed on the substrate 12, the first doped semiconductor layer 20, the light-emitting layer 22, and the second doped semiconductor layer 24. The insulating layer 27 includes openings to expose the first conductive contact 36 and the second conductive contact 38. The first conductive pad 32 passes through the insulating layer 27 and is electrically connected to the first doped semiconductor layer 20 through the first conductive contact 36. The second conductive pad 34 passes through the insulating layer 27 and is electrically connected to the second doped semiconductor layer 24 through the second conductive contact 38. The light-emitting element 100*b* includes a total thickness T' less than 110 μm, for example, between 60 μm~80 μm or between 70 μm~90 μm.

In the light-emitting element 100*b* illustrated in FIG. 3B, the material and the size of the substrate 12, the protrusion 14, the buffer layer 16, the undoped semiconductor layer 18, the first doped semiconductor layer 20, the light-emitting layer 22, and the second doped semiconductor layer 24 are similar to those of the components with same labels of the light-emitting element 10 illustrated in FIG. 1A and the design of the substrate 12 illustrated in FIG. 1B, and those will not be repeated here. In some embodiments, similar to the light-emitting element 100*a* illustrated in FIG. 2B, a transparent conductive layer (such as indium tin oxide (ITO)) can be inserted between the second conductive contact 38 and the second doped semiconductor layer 24. In some embodiments, a current blocking layer may be inserted between the transparent conductive layer and the second doped semiconductor layer 24 and formed corresponding to a position of the second conductive contact 38.

As shown in FIG. 3B, the light-emitting element 100*b* is electrically connected to an external circuit through the first doped semiconductor layer 20, the first conductive contact 36, and the first conductive pad 32. The light-emitting element 100*b* is electrically connected to an external circuit through the second doped semiconductor layer 24, the second conductive contact 38, and the second conductive type pad 34.

The light-emitting element 100*b* can be packaged in the form of flip chip. The light-emitting element 100*b* can be a mini LED.

Figure 3C:
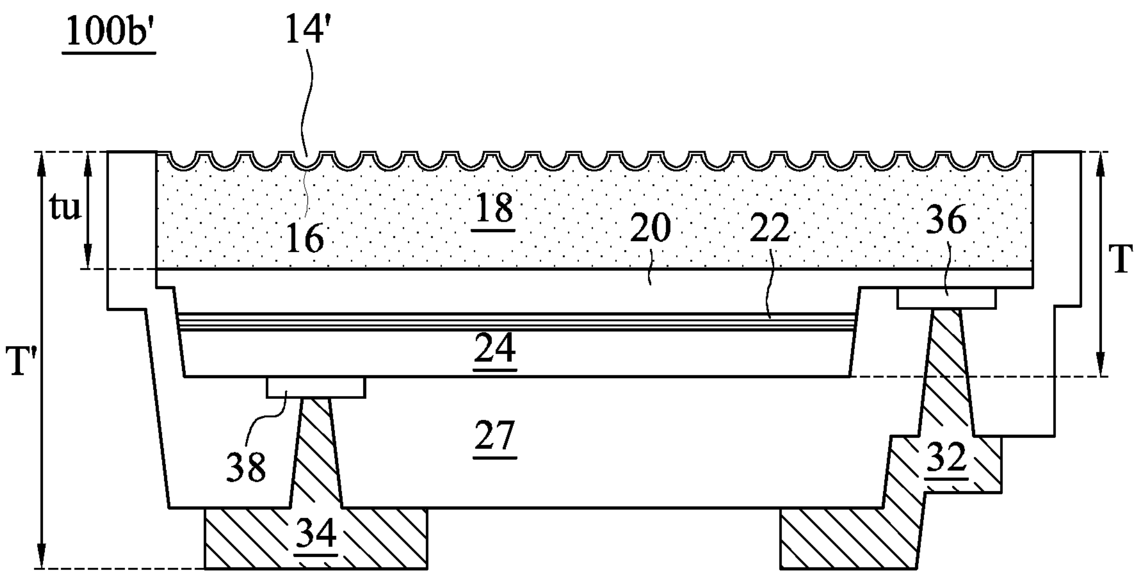
FIG. 3C illustrates a cross-sectional view of a light-emitting element in accordance with an embodiment of the present application.

As shown in FIGS. 3A and 3C, a light-emitting element 100*b*' is provided in accordance with an embodiment of the present application. FIG. 3C illustrates a cross-sectional view along line Y-Y' of the light-emitting element 100*b* in FIG. 3A after removing the substrate 12.

As shown in FIG. 3C, the light-emitting element 100*b*' without the aforementioned substrate 12 includes a plurality of recesses 14', the undoped semiconductor layer 18, the first doped semiconductor layer 20, the light-emitting layer 22, the second doped semiconductor layer 24, the insulating layer 27, the first conductive pad 32, and the second conductive pad 34. In an embodiment, the recess 14' is disposed on the surface of the buffer layer 16. In another embodiment, the recess 14' is disposed on the surface of the undoped semiconductor layer 18. The buffer layer 16 or the undoped semiconductor layer 18 includes a plurality of concave surfaces, and each concave surface forms the recess 14'. The light-emitting layer 22 is formed on the first doped semiconductor layer 20. The second doped semiconductor layer 24 is formed on the light-emitting layer 22. The insulating layer 27 is conformably formed on the surfaces of the undoped semiconductor layer 18, the first doped semiconductor layer 20, the light-emitting layer 22, and the second doped semiconductor layer 24. The first conductive pad 32 passes through the insulating layer 27 and is electrically connected to the first doped semiconductor layer 20 through the first conductive contact 36. The second conductive pad 34 passes through the insulating layer 27 and is electrically connected to the second doped semiconductor layer 24 through the second conductive contact 38. The light-emitting element 100*b*' does not include the substrate 12, and the light-emitting element 100*b*' includes a total thickness T' less than 20 μm, for example, between 5 μm~10 μm.

In the light-emitting element 100*b*' illustrated in FIG. 3C, the size of the recess 14' is similar to that of the protrusion 14 illustrated in FIG. 1A. The recess 14' includes a depth less than or equal to 1 μm, for example, between 0.5 μm~0.9 μm. In some embodiments, in a top view, the recess 14' includes a circle, an ellipse, or a polygon. The polygon includes a pattern selected from a triangle, a quadrangle, and a hexagon. In a cross-sectional view, the recess 14' includes two arcs intersecting at a vertex. However, the present application is not limited thereto, and other cross section shapes are also applicable to the present application, such as semicircle or polygon. In some embodiments, the recess 14' may be composed of a plurality of concave portions having irregular shapes or depths. In some embodiments, the width of the recess 14' is between 0.3 μm~3 μm. In another embodiment, the width of the recess 14' is between 0.5 μm~2 μm. In another embodiment, the width of the recess 14' is between 0.6 μm~1.6 μm. In some embodiments, the aspect ratio (depth/width) of the recess 14' is between 0.55~0.85, or less than 0.7. In some embodiments, the distance between the recesses 14' is between 0.1 μm~0.3 μm.

In the light-emitting element 100*b*' illustrated in FIG. 3C, the materials and the dimensions of the buffer layer 16, the undoped semiconductor layer 18, the first doped semiconductor layer 20, the light-emitting layer 22, and the second doped semiconductor layer 24 are similar to those of the components with same labels of the light-emitting element 10 illustrated in FIG. 1A, and those will not be repeated here. In some embodiments, similar to the light-emitting element 100*a* illustrated in FIG. 2B, the transparent conductive layer (for example, indium tin oxide (ITO)) can be inserted between the second conductive contact 38 and the second doped semiconductor layer 24. In some embodiments, during the removing process of the substrate 12, the buffer layer 16 can be completely or partially removed.

As shown in FIG. 3C, the light-emitting element 100*b*' is electrically connected to an external circuit through the first doped semiconductor layer 20, the first conductive contact 36, and the first conductive pad 32. The light-emitting element 100*b*' is electrically connected to an external circuit through the second doped semiconductor layer 24, the second conductive contact 38, and the second conductive pad 34.

The light-emitting element 100*b*' can be packaged in the form of flip chip. In an embodiment, the light-emitting element 100*b*' is a micro light-emitting diode (micro LED). In an embodiment, the light-emitting element 100*b*' can be bonded to a substrate by flipping the chip to form a thin film flip chip.

With the continuous promotion of the pixel requirements of the display, the pixel pitch is getting smaller and smaller, and the size of the LED chip is also getting smaller and smaller. As a new technology with broad market prospects, small-size LEDs face more and more difficulties and challenges in the manufacturing process. In some embodiments, the light-emitting element 10, 100*a*, 100*b*, or 100*b*' is a small-sized or mini-sized mini LED, includes any side with a length less than 300 μm, for example, the length and width are respectively between 100 μm~200 μm, the height is between 100 μm~200 μm. In some embodiments, the light-emitting element 10, 100*a*, 100*b*, or 100*b*' is a micro light-emitting diode (micro LED), with a width, length or height ranging between 2 μm~5 μm, 5 μm~10 μm, 10 μm~20 μm, 20 μm~50 μm, or 50 μm~100 in.

In some embodiments, the protective layer 28 or the insulating layer 27 includes a single-layer or a multi-layer structure, and includes at least one material selected from $SiO_x$, $SiN_x$, $Al_xO_y$, $Nb_xO_y$, and $TiO_x$. In an embodiment, the protective layer 28 or the insulating layer 27 includes a Distributed Bragg Reflector (DBR) structure, for example, the insulating layer 27 is formed by alternately stacking two materials, such as $TiO_x$ and $SiO_x$. In another embodiment, the material of the protective layer 28 includes $SiN_x$ or $SiO_2$, and the thickness of the protective layer 28 is more than 1 μm or 2 μm but less than 5 μm or 6 μm.

In some embodiments, the first conductive contact 36 and the second conductive contact 38 include conductive metals, such as gold, aluminum, platinum, or silver, or include transparent conductive oxides, such as ITO or ZnO. The first conductive contact 36 and the second conductive contact 38 include an alloy material including at least one of gold germanium nickel, gold beryllium, gold germanium, and gold zinc, or nickel or chromium. In some embodiments, the first conductive pad 32 and the second conductive pad 34 include a reflective metal, such as gold, aluminum, or silver, which reflect the light radiated from the light-emitting layer 22 and penetrating the first doped semiconductor layer 20 and the second doped semiconductor layer 24 towards the light emitting side.

When the light-emitting element 10 and the light-emitting element of the comparative example are mini LED, the electrical characteristics of the light-emitting element 10 and the light-emitting element of the comparative example are compared in Table 1.

This embodiment compares the electrical characteristics of the light-emitting element 10 and the light-emitting element of the comparative example when those structures are applied in the green light mini LED products. The electrical characteristics for comparison include the forward voltage Vf0, Vf1, Vf2, and Vf3 (V, volt) under different electrical currents, the reverse voltage Vr1 (V, volt), the dominant wavelength Wd (nm, nanometer), and the brightness Iv (mcd, millicandela). ESD2KHBM and ESD3KHBM are the yield rate of anti-static discharge ability tested by the human body mode (HBM) at 2000V and 3000V. ESD200MM is the yield rate of anti-static discharge ability tested by machine mode (MM) at 200V. The measurement results are shown in Table 1.

TABLE 1

| | Vf0(V) | Vf1(V) | Vf2(V) | Vf3(V) | Vr1(V) |
|---|---|---|---|---|---|
| light-emitting element 10 | 1.99 | 2.09 | 2.42 | 2.78 | 32.16 |
| light-emitting element of the comparative example | 2.00 | 2.12 | 2.42 | 2.83 | 39.92 |

| | Wd (nm) | Iv (mcd) | ESD2KHBM (%) | ESD3KHBM (%) | ESD200MM (%) |
|---|---|---|---|---|---|
| light-emitting element 10 | 534.63 | 91.45 | 99.92 | 99.52 | 99.52 |
| light-emitting element of the comparative example | 531.3 | 100.16 | 91.67 | 24.06 | 98.42 |

When the light-emitting element 10 and the light-emitting element of the comparative example are mini LED, the electrical characteristics of light-emitting element 10 and the light-emitting element of the comparative example are compared in Table 2.

This embodiment compares the electrical characteristics of the light-emitting element 10 and the light-emitting element of the comparative example when those structures are applied in the blue light mini LED products. The electrical characteristic for comparison include the forward voltage Vf0, Vf1, Vf2, and Vf3 (V, volt) under different electrical currents, the reverse voltage Vr1 (V, volt), the dominant wavelength Wd (nm, nanometer), and the brightness Iv (mcd, millicandela), ESD2KHBM, ESD3KHBM are the yield rate of anti-static discharge ability tested by the human body mode (HBM) at 2000V and 3000V. ESD200MM is the yield rate of anti-static discharge ability tested by machine mode (MM) at 200V. The measurement results are shown in Table 2.

TABLE 2

| | Vf0(V) | Vf1(V) | Vf2(V) | Vf3(V) | Vr1(V) |
|---|---|---|---|---|---|
| light-emitting element 10 | 2.29 | 2.42 | 2.64 | 2.87 | 33.94 |
| light-emitting element of the comparative example | 2.32 | 2.44 | 2.65 | 2.89 | 39.99 |

| | Wd (nm) | Iv (mcd) | ESD2KHBM (%) | ESD3KHBM (%) | ESD200MM (%) |
|---|---|---|---|---|---|
| light-emitting element 10 | 467.42 | 16.74 | 99.77 | 99.77 | 99.85 |
| light-emitting element of the comparative example | 465.65 | 15.86 | 98.83 | 60.91 | 99.79 |

Since the lattice constant of the nitride semiconductor is different from that of the epitaxial growth substrate, the light-emitting layer is easily affected by dislocation defects caused by lattice mismatch, and the epitaxial structure is relatively fragile in electrics and mechanics. The present application can reduce the epitaxial structure from being influenced by the lattice constant mismatch of the substrate.

ESD2KHBM, ESD3KHBM, and ESD200MM are the withstand voltage characteristics under the test of the human body discharge mode and the machine discharge mode. The larger the value is, the higher the yield rate of anti-static discharge ability is, and the higher yield of the products that can withstand electrostatic breakdown and static resistance. As the size of mini LED and micro LED shrinks, the electrode spacing decreases (for example, less than 20 μm), and the electric field strength is inversely proportional to the electrode spacing. When the high current is confined in a small area, the high current density easily leads to the local burnout of mini LED and micro LED. Vf0, Vf1, Vf2, and Vf3 under different currents are related to the driving voltage, and decreasing the driving voltage can drive the light-emitting element at the lower current and the life time of the light-emitting element is improved. From the data in Table 1 and Table 2, it can be seen that when the light-emitting element 10 of the present application is applied to small-sized mini LED products, the electrical characteristics such as Vf and ESD present great advantages.

The following examples illustrates the ratio C % of the surface area A1 of the substrate to the surface area A2 of the protrusion of different light-emitting elements.

The first light-emitting element: the protrusion includes a height of 0.9 in, a width of 1.6 μm, a reflective area of 1.2 $\mu m^2$, and a distance of 0.2 μm. The ratio C % of the surface area A1 of the substrate to the surface area A2 of the protrusion of the first light-emitting element is 40.7%. The above data is summarized in Table 3.

The second light-emitting element: the protrusion includes a height of 0.85 μm, a width of 1.5 μm, a reflective area of 1.1 $\mu m^2$, and a distance of 0.2 μm. The ratio C % of the surface area A1 of the substrate to the surface area A2 of the protrusion of the second light-emitting element is 42.1%. The above data is summarized in Table 3.

The third light-emitting element: the protrusion includes a height of 0.8 μm, a width of 1.4 μm, a reflective area of 1.1 $\mu m^2$, and a distance of 0.2 μm. The ratio C % of the surface area A1 of the substrate to the surface area A2 of the protrusion of the third light-emitting element is 43.7%. The above data is summarized in Table 3.

The fourth light-emitting element: the protrusion includes a height of 0.8 μm, a width of 1.0 μm, a reflective area of 0.9 $\mu m^2$, and a distance of 0.2 μm. The ratio C % of the surface area A1 of the substrate to the surface area A2 of the protrusion of the fourth light-emitting element is 44.2%. The above data is summarized in Table 3.

The fifth light-emitting element: the protrusion includes a height of 0.7 μm, a width of 0.8 μm, a reflective area of 0.8 $\mu m^2$, and a distance of 0.2 μm. The ratio C % of the surface area A1 of the substrate to the surface area A2 of the protrusion of the fifth light-emitting element structure is 49.1%. The above data is summarized in Table 3.

TABLE 3

| protrusion | first light-emitting element | second light-emitting element | third light-emitting element | fourth light-emitting element | fifth light-emitting element |
|---|---|---|---|---|---|
| height (μm) | 0.9 | 0.85 | 0.8 | 0.8 | 0.7 |
| width (μm) | 1.6 | 1.5 | 1.4 | 1.0. | 0.8 |
| reflective area ($\mu m^2$) | 1.2 | 1.1 | 1.1 | 0.9 | 0.8 |
| distance (μm) | 0.2 | 0.2 | 0.2 | 0.2 | 0.2 |
| C % | 40.7 | 42.1 | 43.7 | 44.2 | 49.1 |

The C % of the light-emitting elements with a larger size in accordance with an embodiment of the application applied to various products is as follows:

Lighting equipment: C %=29%~32%
Outdoor display: C %=35%~38%
Indoor display: C %=38%~41%
TV/computer monitor: C %=41%~45%
Mobile phone/panel display: C %=45%~48%

In accordance with an embodiment of the application, the C % of light-emitting element with a smaller size, such as mini LED/micro LED, is larger than or equal to 49.1%

The applications of the light-emitting element in accordance with an embodiment of the present application are wide, for example, the light-emitting element in accordance with an embodiment of the present application can be applied from large-sized outdoor displays and indoor displays to small-sized mini LEDs or micro LEDs. Due to the large adjustment space for the electrical characteristics of the product, it can meet various special electrical characteristic requirements and the application range is wider.

Figure 4:
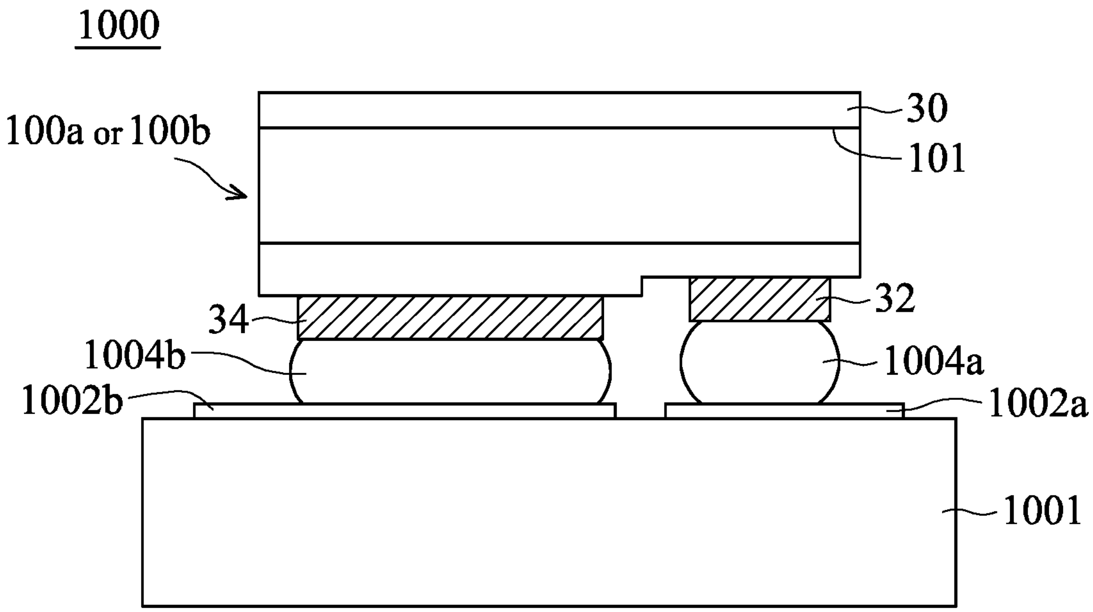
FIG. 4 illustrates a schematic diagram of a light-emitting apparatus.

As shown in FIG. 4, a light-emitting apparatus 1000 is provided in accordance with an embodiment of the present application. FIG. 4 illustrates a cross-sectional view of the light-emitting apparatus 1000.

As shown in FIG. 4, the light-emitting apparatus 1000 includes a circuit board 1001 and the light-emitting element 100*a* or 100*b* disposed on the circuit board 1001. The circuit board 1001 includes a first external electrode 1002*a* and a second external electrode 1002*b*. The first conductive pad 32 and the second conductive pad 34 of the light-emitting element 100*a* or 100*b* are respectively connected to the first external electrode 1002*a* and the second external electrode 1002*b* through a first welding portion 1004*a* and a second welding portion 1004*b*.

The circuit board 1001 includes an insulating resin board, a ceramic board, or a metal board, for example, a printed circuit board (PCB), a metal base printed circuit board (MCPCB), or a flexible printed circuit board (FPCB).

As shown in FIG. 4, a first surface 101 of the light-emitting element 100*a* or 100*b* is the main light-emitting surface. An optical field adjustment layer 30 is disposed on the first surface 101 of the light-emitting element 100*a* or 100*b*. In some embodiments, the optical field adjustment layer 30 includes a multi-layer structure formed of at least two materials selected from $SiO_x$, $SiN_x$, $Al_xO_y$, $Nb_xO_y$, and $TiO_x$. In an embodiment, the optical field adjustment layer 30 includes a Distributed Bragg Reflector (DBR) structure, for example, the optical field adjustment layer 30 is formed by alternately stacking two materials of $TiO_x$ and $SiO_x$. In one embodiment, the optical field adjustment layer 30 includes a single-layer structure including the metal.

Figure 5:
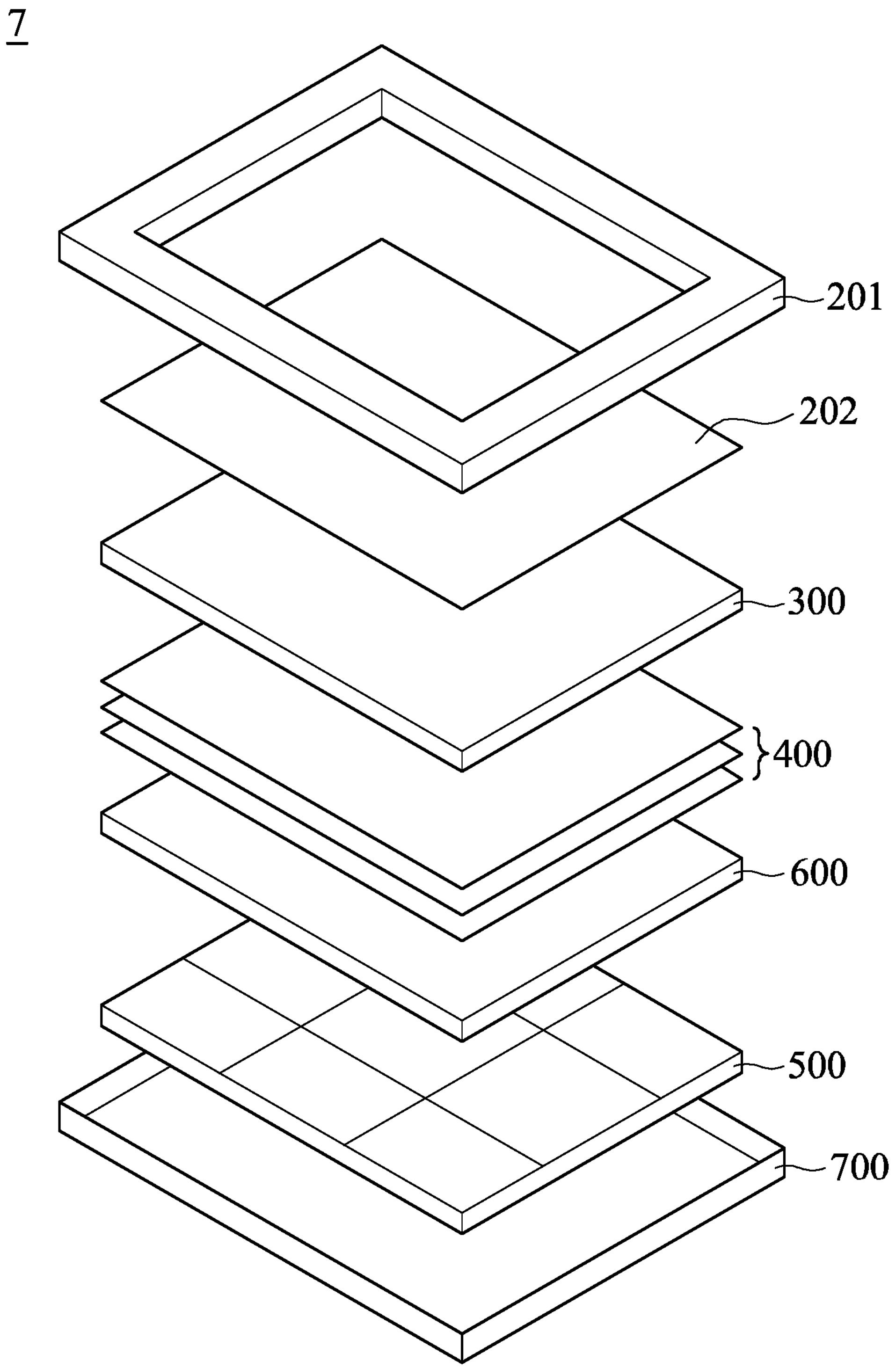
FIG. 5 illustrates a schematic diagram of a backlight module.

As shown in FIG. 5, a backlight module 7 is provided in accordance with an embodiment of the present application. FIG. 5 illustrates a schematic diagram of the backlight module 7.

As shown in FIG. 5, the backlight module 7 includes a first frame 201, a liquid crystal display panel 202, a brightness enhancement film 300, an optical module 400, a light-emitting module assembly 500, and a second frame 700. The light-emitting module assembly 500 includes a plurality of light-emitting apparatuses 1000 illustrated in FIG. 4 or any one of the above light-emitting elements 100*a*, 100*b*, and 100*b*' illustrated in FIGS. 2A to 3C, the light output mode of the light-emitting module assembly 500 can be an edge type or a direct type. The backlight module 7 further includes a wavelength conversion structure 600 disposed on the light-emitting module assembly 500.

Figure 6:
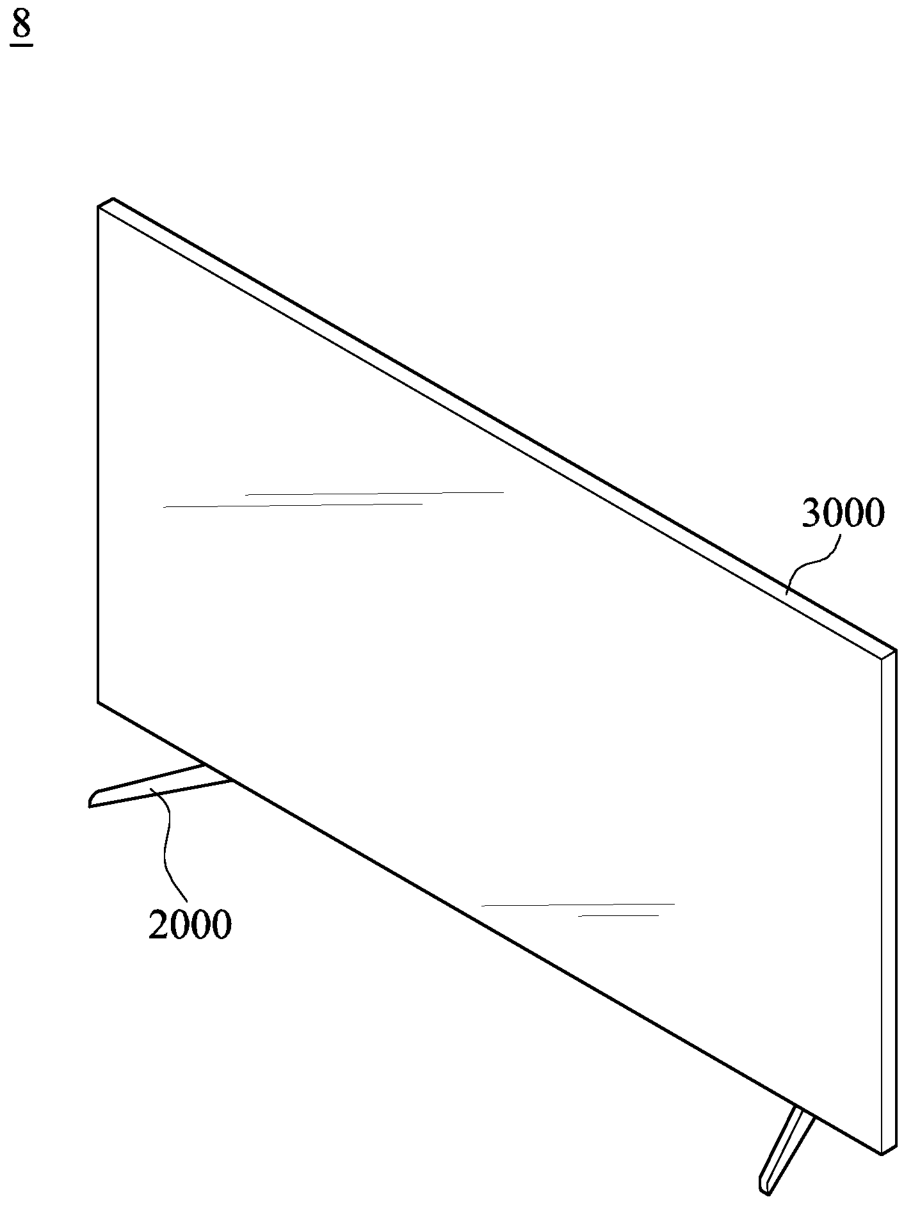
FIG. 6 illustrates a schematic diagram of a display.

As shown in FIG. 6, a display 8 is provided in accordance with an embodiment of the present application. FIG. 6 illustrates a schematic diagram of the display 8.

As shown in FIG. 6, the display 8 includes an LED light-emitting panel 3000 and a current source (not shown). The bracket 2000 can support the LED light-emitting panel 3000. The LED light-emitting panel 3000 includes a plurality of light-emitting elements 1000 illustrated in FIG. 4 or any one of the light-emitting elements 100*a*, 100*b*, and 100*b*' illustrated in FIGS. 2A to 3C. The LED lighting panel 3000 includes a plurality of pixel units. Each pixel unit includes a plurality of light-emitting elements or a plurality of light-emitting apparatuses that emit different colors. For example, each pixel unit includes three light-emitting elements that emit red light, green light, and blue light respectively.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A light-emitting element, comprising:

a substrate comprising a first upper surface;

a plurality of protrusions formed on the first upper surface, wherein the plurality of protrusions comprises a height less than or equal to 1.2 μm; and a stack structure comprising a buffer layer, an undoped semiconductor layer, a first doped semiconductor layer, a light-emitting layer, and a second doped semiconductor layer sequentially formed on the substrate, the second doped semiconductor layer comprising a second upper surface;

a conductive member formed on the second upper surface of the second doped semiconductor layer;

wherein the stack structure comprises a total thickness less than 5 μm from the first upper surface of the substrate to the second upper surface of the second doped semiconductor layer.

2. The light-emitting element in accordance with claim 1, wherein the substrate comprises a sapphire substrate.

3. The light-emitting element in accordance with claim 1, wherein the plurality of protrusions comprises a cone shape.

4. The light-emitting element in accordance with claim 1, wherein the height is between 0.65 μm~0.95 μm.

5. The light-emitting element in accordance with claim 3, wherein the plurality of protrusions comprises a width between 0.6 μm~1.6 μm.

6. The light-emitting element in accordance with claim 3, wherein the plurality of protrusions comprises an aspect ratio between 0.55~0.85.

7. The light-emitting element in accordance with claim 3, wherein a distance between two adjacent ones of the plurality of protrusions is between 0.1 μm~0.3 μm.

8. The light-emitting element in accordance with claim 3, wherein a distance between two adjacent ones of the plurality of protrusions is between 0.6 μm~1.6 μm.

9. The light-emitting element in accordance with claim 3, wherein a ratio of an area of the substrate not occupied by the plurality of protrusions to an area of the plurality of protrusions is greater than 35%.

10. The light-emitting element in accordance with claim 1, wherein the buffer layer comprises aluminum oxynitride conformably formed on the first upper surface of the substrate and the plurality of protrusions.

11. The light-emitting element in accordance with claim 10, wherein a ratio of an aluminum content to a nitrogen content of the buffer layer is between 0.45~0.9.

12. The light-emitting element in accordance with claim 10, wherein a difference between an aluminum content of the buffer layer on a sidewall of the plurality of protrusions and an aluminum content of the buffer layer on the first upper surface of the substrate is greater than 5% but less than 12%.

13. The light-emitting element in accordance with claim 11, wherein the buffer layer includes comprises a thickness between 15 nm and 25 nm.

14. The light-emitting element in accordance with claim 11, wherein a thickness of the buffer layer on a sidewall of the plurality of protrusions is smaller than a thickness of the buffer layer on the upper surface of the substrate.

15. The light-emitting element in accordance with claim 1, wherein a thickness of the first doped semiconductor layer and a thickness of the undoped semiconductor layer comprises a ratio between 0.9~1.1.

16. The light-emitting element in accordance with claim 1, wherein the undoped semiconductor layer comprises a thickness less than 2 μm.

17. The light-emitting element in accordance with claim 1, the light-emitting element includes a total thickness less than 110 μm.

18. The light-emitting element in accordance with claim 17, wherein the undoped semiconductor layer comprises a thickness greater than 0.5 μm and less than 1.5 μm thicker than the height of the plurality protrusions.

19. A light-emitting element, comprising:

a substrate comprising an upper surface;

a plurality of protrusions formed on the upper surface, wherein the plurality of protrusions comprises a height less than or equal to 1.2 μm; and a stack structure formed on the substrate, wherein the stack structure comprises a buffer layer, a first doped semiconductor layer, a light-emitting layer, and a second doped semiconductor layer; and wherein the stack structure comprises a total thickness less than 5 μm;

wherein a difference between an aluminum content of the buffer layer on a sidewall of the plurality of protrusions and an aluminum content of the buffer layer on the upper surface of the substrate is greater than 5% but less than 12%.

20. The light-emitting element in accordance with claim 19, wherein the buffer layer comprises aluminum oxynitride conformably formed on the upper surface of the substrate and the plurality of protrusions.

* * * * *